United States Patent [19]
MacIntrye

[11] Patent Number: 5,982,030
[45] Date of Patent: Nov. 9, 1999

[54] RIGID PACKAGE WITH LOW STRESS MOUNTING OF SEMICONDUCTOR DIE

[76] Inventor: Donald Malcom MacIntrye, P.O. Box 641686, San Jose, Calif. 95164

[21] Appl. No.: 09/032,725

[22] Filed: Feb. 27, 1998

[51] Int. Cl.⁶ .................................................. H01L 23/053
[52] U.S. Cl. .......................... 257/701; 257/704; 257/679; 257/701; 361/749
[58] Field of Search ...................................... 257/678, 679, 257/668, 698, 699, 688, 701, 704, 710, 723, 724, 729, 708, 730, 773, 922; 361/720, 721, 735, 736, 737, 748, 749, 750, 752, 760, 783, 789, 790

[56] References Cited

U.S. PATENT DOCUMENTS 5,646,447  7/1997  Nicewarner, Jr. et al. ............. 257/723

Primary Examiner—Tom Thomas
Assistant Examiner—Luan Thai
Attorney, Agent, or Firm—H. Donald Nelson

[57] ABSTRACT

A package providing low stress mounting for semiconductor die having a base plate, a flexible printed wiring circuit wrapped around the base plate with a first portion of the flexible printed wiring circuit adhesively attached to an external side of the base plate and a cap attached to the periphery of the base plate forming a space between the base plate and the cap in which a second portion of the flexible printed wiring circuit is disposed. The space formed between the base plate and the cap is filled with air, a soft gel, or a material such as RTV. The semiconductor die are mounted on the portion of the flexible printed wiring circuit disposed in the space formed between the base plate and the cap. The portion of the flexible printed wiring circuit adhesively attached to the base plate has pads that communicate to an external device. The pads are in electrical communication with the semiconductor mounted on the flexible printed wiring circuit.

6 Claims, 3 Drawing Sheets

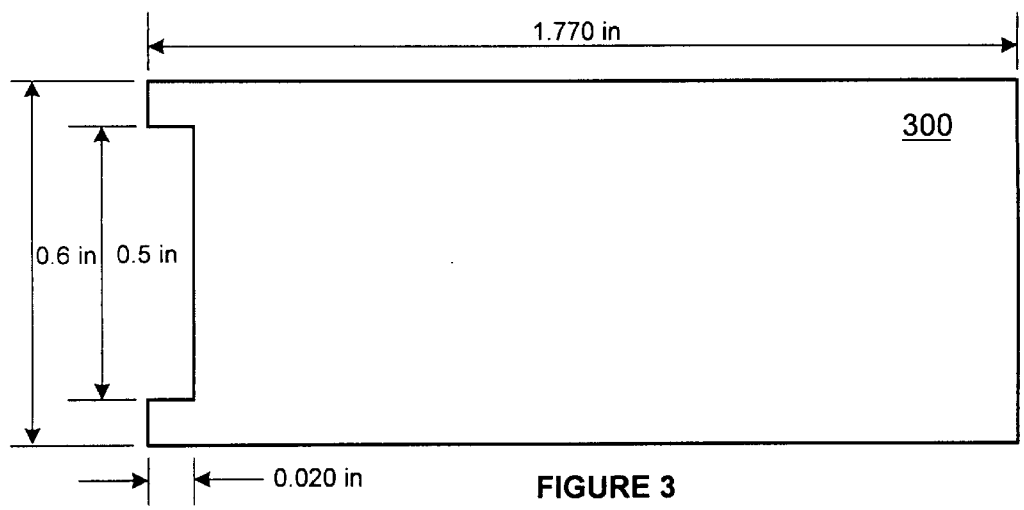
FIGURE 3
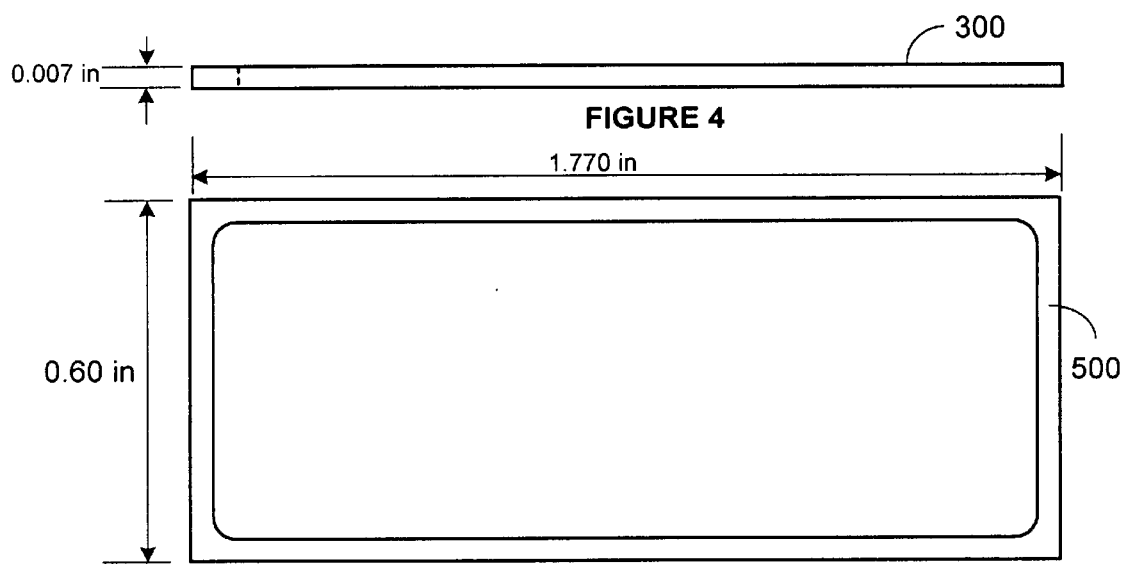
FIGURE 4
FIGURE 5
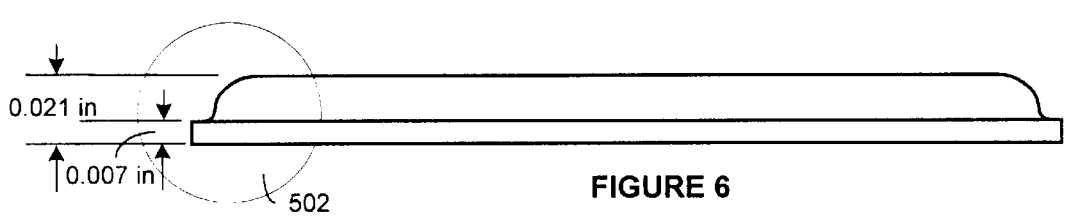
FIGURE 6
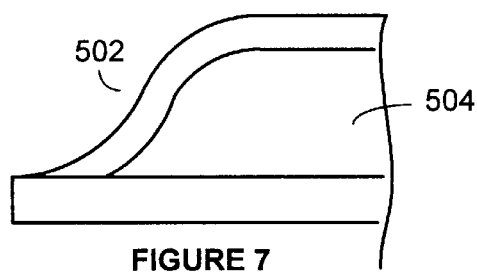
FIGURE 7

RIGID PACKAGE WITH LOW STRESS MOUNTING OF SEMICONDUCTOR DIE

BACKGROUND OF THE INVENTION

1. Field of the Invention

This invention relates generally to a package for the mounting of a semiconductor die such as a semiconductor memory device and more particularly, to a semiconductor memory device and even more particularly, to a rigid package for the low stress mounting of a semiconductor die such as a semiconductor memory device in which any flex of the rigid package is not transmitted to the semiconductor die.

2. Discussion of the Related Art

There is an increasing demand for media cards that contain semiconductor die that can be carried around by end-users in their wallets or handbags. Examples of such media would be telephone cards that are approximately the size of a standard credit card and that can be carried in a wallet. Other examples include credit cards that contain one or more semiconductor die that could, for example, contain semiconductor memory device to store account information in addition to account numbers and identification information. In addition, such a card could store cash balances that would be reduced as the card is used for purchases. As can be appreciated, if such cards are to carry such information it is mandatory that the cards are reliable so that such cash balances are not lost. As is known in the semiconductor memory art, the semiconductor memory devices that are typically used are memory devices such as Flash memory devices. All such semiconductor devices are known as chips and are manufactured on silicon substrates that are very fragile and unable to withstand any appreciable bending stress.

As can be appreciated, such cards are typically carried in wallets and are subjected to flexing and bending. Because of the necessity to maintain the small size of the cards it has proven difficult to provide a package that is small enough and at the same time rigid enough to prevent bending stresses from being transferred to semiconductor die contained within the package.

Therefore, what is needed is a package in which to mount semiconductor die that prevent bending stresses from reaching the semiconductor die.

SUMMARY OF THE INVENTION

The present invention is directed to a package that provides a low stress mounting for semiconductor die. The package is fabricated from a base plate, a flexible printed wiring circuit wrapped around the base plate with a portion of the flexible printed wiring circuit adhesively attached to an external side of the base plate. A cap is attached to the periphery of the base plate providing a space between the cap and the base plate. A second portion of the flexible printed wiring circuit is disposed in the space formed between the cap and the base plate. The semiconductor die are mounted on the portion of the flexible printed wiring circuit disposed in the space formed between the cap and the base plate.

The space between the cap and the base plate is filled with air, a soft gel or a material such as RTV.

The portion of the flexible printed wiring circuit adhesively attached to the external side of the base plate has pads that are in electrical communication with the semiconductor die mounted on the flexible printed wiring circuit.

The described package is a rigid package for the low stress mounting of a semiconductor die in which any flex in the rigid package is not transmitted to the semiconductor die.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIG. 3 is a plan view of a base plate on which the flex circuit shown in FIGS. 1 & 2 is to be mounted.

FIG. 4 is a side view of the base plate shown in FIG. 3.

FIG. 5 is a top view of the cap that is welded to the base plate shown in FIGS. 3 & 4 to provide an enclosure in which the semiconductor die are enclosed.

FIG. 6 is a side view of the cap shown in FIG. 5.

FIG. 7 is an enlarged view of an end of the cap shown in FIG. 6.

DETAILED DESCRIPTION

Reference is now made in detail to a specific embodiment of the present invention that illustrates the best mode presently contemplated by the inventor for practicing the invention. The following figures are not drawn to scale and it is to be noted that the vertical distances representing thicknesses of the elements are drawn to a larger scale for clarity purposes. Representative thickness dimensions are indicated, where appropriate, in several of the figures.

Figure 1:
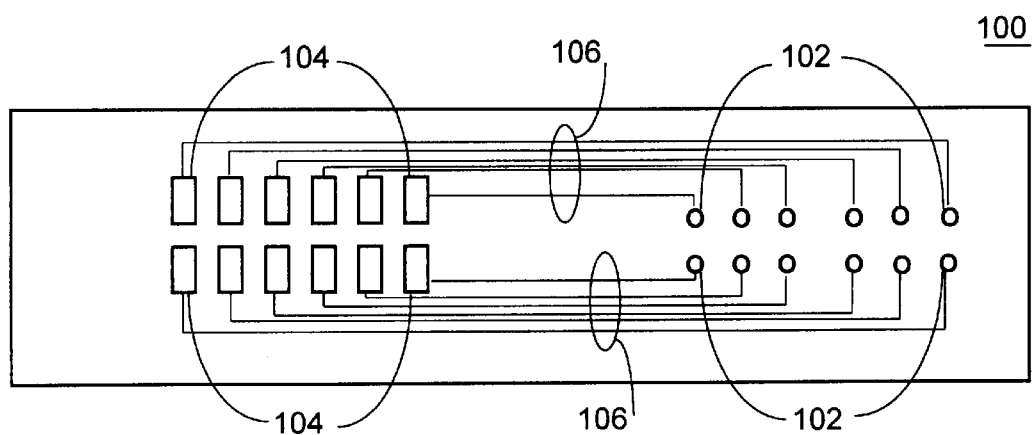
FIG. 1 is a plan view of a flex circuit on which one or more semiconductor die are to be mounted.

FIG. 1 is a plan or top view of a flexible printed wiring circuit 100 showing twelve contacts, indicated at 102 that are to make contact with a semiconductor die to be discussed later. Also shown on the flexible printed wiring circuit 100 are pads, indicated at 104, that will make contact with an external device. The pads 104 are in electrical communication with contacts 102 via wires, indicated at 106. Flexible printed wiring is well-known in the semiconductor packaging art and can be designed to provide a desired configuration such as that shown in FIG. 1. Typically, flexible printed wiring is used in dynamic as well as static applications, where bending or folding is required. The flexible printed wiring can be fabricated in single-sided, double-sided, or multi-layer configurations. In this application, the flexible printed wiring is a single-sided configuration with the contacts 102 and the pads 104 formed on the same side. Flexible printed wiring are typically the thinnest and lightest of any technology with a total thickness of less than 0.010 inches. As will be discussed below, a portion of one side of the flexible printed wiring will be adhesively attached to a base plate. The laminates used in the manufacture of flexible printed wiring are typically a composite of metal conductor and a dielectric substrate bonded together with or without an adhesive system and overcoated with a protective material. Copper is the conductor material most often used, but aluminum or other metal connectors and/or conductive polymer thick films can also be used. Typically, flexible circuitry is built on polyimide and polyester films, however, aramid and fluorocarbon films can also be used for some applications. It is to be understood that the present invention comprehends any type of flexible printed wiring.

Figure 2:
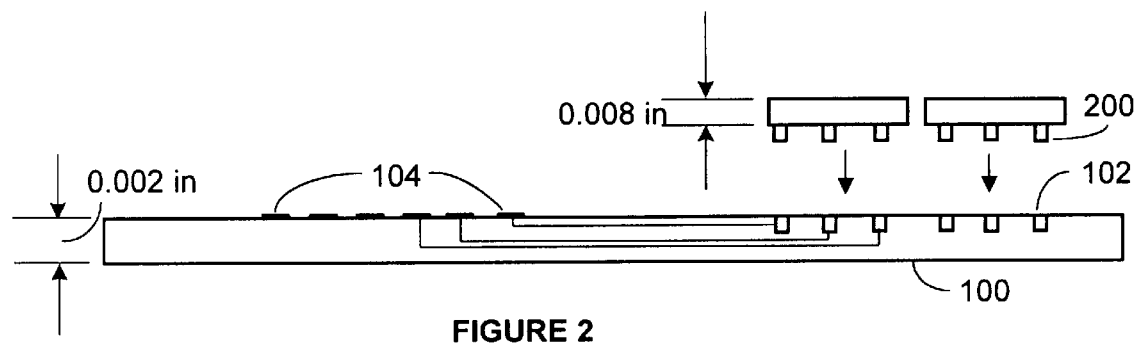
FIG. 2 is a side view of the flex circuit shown in FIG. 1 with two semiconductor die ready to be mounted on the flex circuit.

FIG. 2 is a side view of the flexible printed wiring circuit 100 shown in FIG. 1. Also shown are two semiconductor die, 200 and 202. The semiconductor die 200 and 202 can be mounted to the flexible printed wiring circuit 100 in any way known in the semiconductor packaging art. It is noted that the same numeral indicators are used for the same elements in the various figures. Methods include, but not limited to, a flip-chip mounting method in which solder bumps 200 on the semiconductor die are matched to pads on the flexible printed wiring circuit, such as the contacts 102. Other types of mounting can be used, such as wire bond technology.

It is to be understood that any method of mounting die to the flexible printed wiring circuit is comprehended by this invention. For illustrative purposes only, vertical dimensions are shown, for example, the thickness of the flexible printed wiring circuit 100 is shown to be 0.0022 inches. The semiconductor die 200 and 202 are shown having a thickness of 0.008 inches. It should be understood that the dimensions are representative only and are shown for illustrative purposes only.

FIG. 3 is a top view of a base plate 300 on which the flexible printed wiring circuit 100 is to be mounted. The base plate can be fabricated from any suitable rigid material and is preferably fabricated from stainless steel. Representative dimensions are shown in FIG. 3 and are only illustrative dimensions.

FIG. 4 is a side view of the base plate 300 and a thickness dimension is shown, also for illustrative purposes only.

FIG. 5 is a top view of a cap 500 that is to be edge-welded to the base plate 300 after the flexible printed wiring circuit 100 is mounted onto the base plate 300.

FIG. 6 is a side view of the cap 500 shown in FIG. 5. The thickness dimensions are shown for illustrative purposes. An end 502 is shown encircled and is shown enlarged in FIG. 7. The cap is constructed to have a space, indicated at 502, in which a portion of the flexible printed wiring circuit 100 will be mounted.

Figure 8:
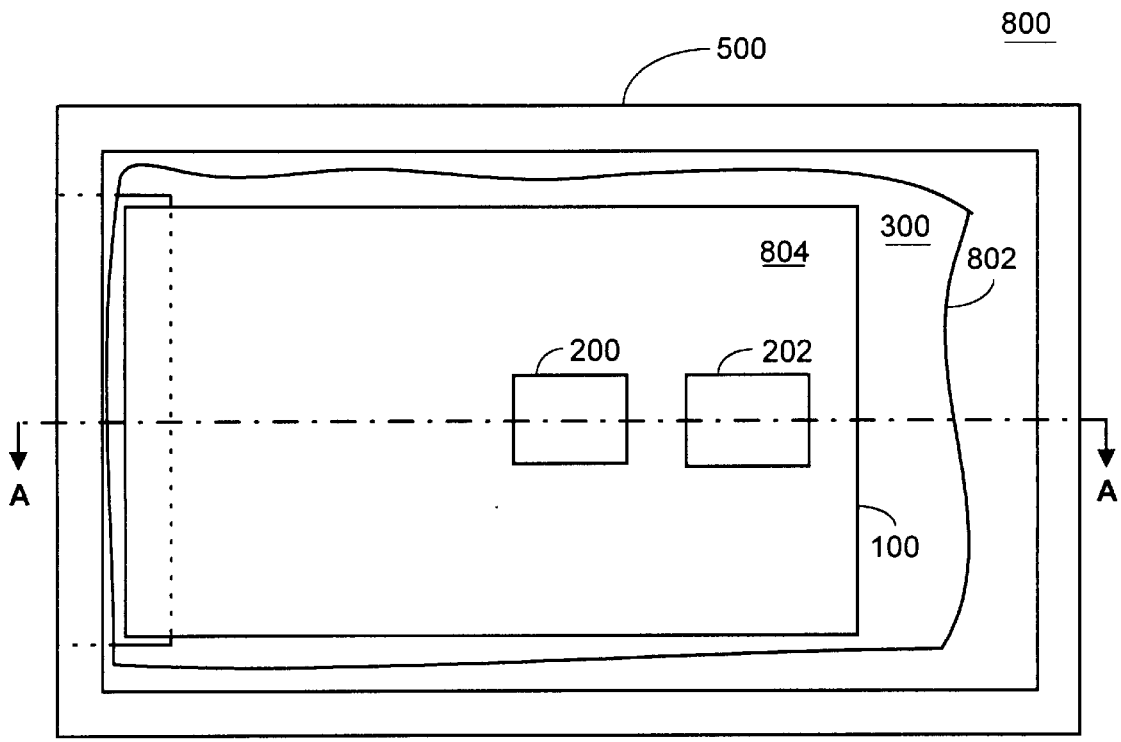
FIG. 8 is a top view of an assembled package of the present invention with the top of the cap cut away showing the flex circuit with the semiconductor die mounted on the flex circuit.

FIG. 8 is a top view of a media card 800 fabricated in accordance with the present invention. The cap 500 is shown cut away at 802 to show a portion 804 of the flexible printed wiring circuit 100. The flexible printed wiring circuit 100 is shown with the two semiconductor die 200 and 202 mounted. A portion of the base plate 300 is visible around the periphery of the flexible printed wiring circuit 100. The cross-section represented by AA is shown in FIG. 9.

Figure 9:
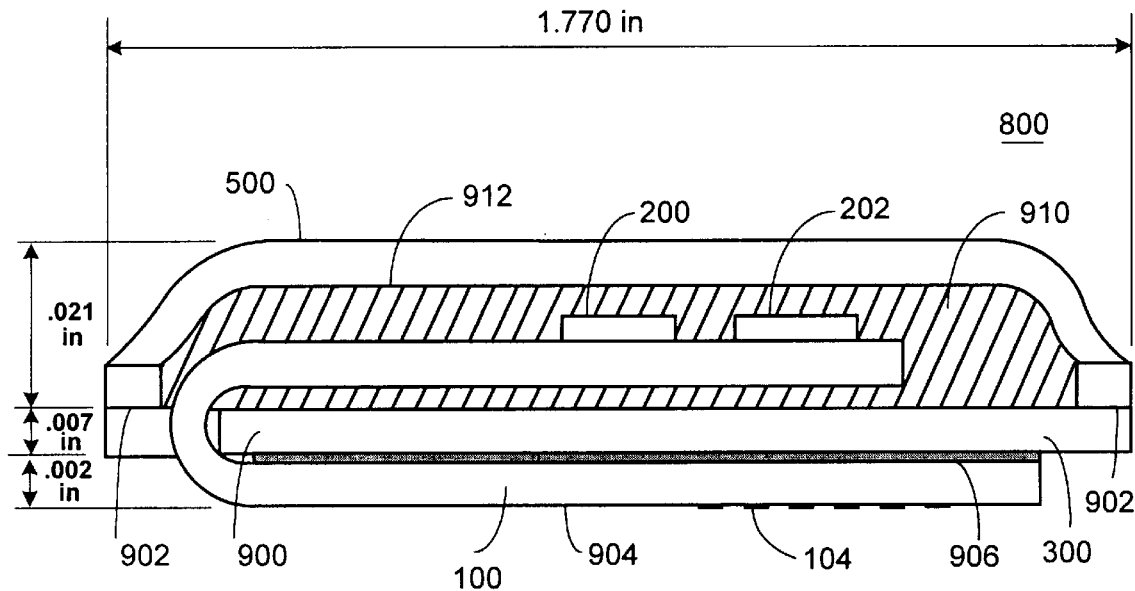
FIG. 9 is a cross-sectional view of the assembled package shown in FIG. 8.

FIG. 9 shows the cross-section AA, indicated in FIG. 8, of the media card 800. The flexible printed wiring circuit 100 is shown bent around an end 900 of the base plate 300. The cap 500 is shown attached to the base plate 300. The preferred method of attaching the cap 500 to the base plate 300 is to edge-weld the cap 500 to the base plate 300. The edge-weld is indicated at 902. A first portion, indicated at 904, of the flexible printed wiring circuit 100 is attached to the base plate 300 with an adhesive, indicated by the shaded area 906. It should be understood, that typically adhesive does not have an appreciable thickness and the shaded area is shown having a thickness for illustrative purposes only. A second portion, indicated at 908, of the flexible printed wiring circuit 100, is in a space 910 formed by the base plate 300 and the cap 500. The space 910 is shown cross-hatched. The space 910 can be filled with a medium such as air or a medium such as RTV or soft gel. The purpose of the space filled with a soft gel is to suspend the portion 908 of the flexible printed wiring circuit 100 in a medium that will not transmit bending stresses to the mounted semiconductor die 200 and 202. If the medium in the space 910 is air an insulation layer of a soft material can be formed on the top surface 912 of the cap 500. The total thickness of the media card 800 is approximately 0.030 inches, with the cap having a thickness of approximately 0.021 inches, the base having a thickness of approximately 0.007 inches and the flexible printed wiring circuit having a thickness of approximately 0.002 inches. It is reiterated that these thicknesses are only representative and are provided for illustrative purposes only.

In summary, the advantages of the package of the present invention can now be more fully realized. The package provides a low stress mounting of a semiconductor die in which any flex of the package is not transmitted to the semiconductor die.

The foregoing description of the embodiment of the invention has been presented for purposes of illustration and description. It is not intended to be exhaustive or to limit the invention to the precise form disclosed. Obvious modifications or variations are possible in light of the above teachings. The embodiments was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A package providing low stress mounting for semiconductor die, comprising:

a base plate;

a flexible printed wiring circuit wrapped around the base plate with a first portion of the flexible printed wiring circuit adhesively attached to an external side of the base plate; and a cap attached to a periphery of the base plate providing a space formed between the cap and the base plate with a second portion of the flexible printed wiring circuit disposed in the space formed between the cap and the base plate.

2. The package of claim 1, wherein the semiconductor die are mounted on the second portion of the flexible printed wiring circuit.

3. The package of claim 2, wherein the cap is edge welded to the base plate.

4. The package of claim 3, wherein the cap and the base plate are formed of stainless steel.

5. The package of claim 4, wherein the space formed between the cap and the base plate is filled with a soft pliable medium selected from the group consisting of air, a soft gel and RTV.

6. The package of claim 5, wherein the first portion of the flexible printed wiring circuit have pads to communicate to and from an external device and wherein the pads are in electrical communication with the semiconductor die mounted on the second portion of the flexible printed wiring circuit.

* * * * *